United States Patent
Wen et al.

(10) Patent No.: US 11,688,739 B2
(45) Date of Patent: Jun. 27, 2023

(54) LOGIC CIRCUIT CAPABLE OF PREVENTING LATCH-UP

(71) Applicant: PixArt Imaging Inc., Hsin-Chu County (TW)

(72) Inventors: Yung-Ju Wen, Hsin-Chu County (TW); Han-Chi Liu, Hsin-Chu County (TW); Hsin-You Ko, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 76 days.

(21) Appl. No.: 17/206,862

(22) Filed: Mar. 19, 2021

(65) Prior Publication Data

US 2022/0302112 A1    Sep. 22, 2022

(51) Int. Cl.
*H01L 27/092* (2006.01)

(52) U.S. Cl.
CPC .................. *H01L 27/0921* (2013.01)

(58) Field of Classification Search
None
See application file for complete search history.

(56) References Cited

U.S. PATENT DOCUMENTS

| | | | | |
|---|---|---|---|---|
| 5,406,513 A * | 4/1995 | Canaris | ............... | H01L 27/0921 257/376 |
| 6,583,470 B1 * | 6/2003 | Maki | ................... | H01L 27/0921 257/349 |
| 8,472,276 B1 * | 6/2013 | Barbara | ................. | G11C 5/147 365/189.05 |
| 2002/0130332 A1 * | 9/2002 | Cho | .................... | H01L 27/0921 257/147 |
| 2008/0094100 A1 * | 4/2008 | Perisetty | .......... | H03K 19/00315 326/31 |
| 2013/0094113 A1 * | 4/2013 | Ker | ........................ | H01L 23/62 361/56 |
| 2014/0167102 A1 * | 6/2014 | Yang | ................... | H01L 27/0921 257/133 |
| 2015/0123184 A1 * | 5/2015 | Wang | .................. | H01L 27/0274 257/315 |
| 2018/0301445 A1 * | 10/2018 | Yam | .................... | H01L 27/0262 |

FOREIGN PATENT DOCUMENTS

KR        20100040470 A   *   4/2010

OTHER PUBLICATIONS (17206862_2022-07-29_KR_20100040470_A_1.pdf) English translation of KR 20100040470 A, Apr. 20, 2010 (Year: 2010).*

* cited by examiner

*Primary Examiner* — Khaja Ahmad
(74) *Attorney, Agent, or Firm* — Hauptman Ham, LLP

(57) ABSTRACT

There is provided a logic circuit capable of preventing latch-up. The conducting of a parasitic SCR is prevented by doping an additional N+ active region in the N well region of a PMOS transistor and doping an additional P+ active region in the P well region of an NMOS transistor so as to prevent the occurrence of latch-up.

11 Claims, 6 Drawing Sheets

LOGIC CIRCUIT CAPABLE OF PREVENTING LATCH-UP

BACKGROUND

1. Field of the Disclosure

This disclosure generally relates to a logic circuit and, more particularly, to a standard logic cell that prevents the latch-up of a parasitic silicon control rectifier (SCR) between the source of a PMOS transistor and the source of an NMOS transistor.

2. Description of the Related Art

In the CMOS integrated circuit, the parasitic bipolar transistor structure is created corresponding to forming of the MOS transistor. In a PMOS transistor of the CMOS transistor, a P+ active region used as a source of the PMOS transistor longitudinally forms a parasitic PNP bipolar transistor with an n-well region and a p-well region. In an NMOS transistor of the CMOS transistor, an N+ active region used as a source of the NMOS transistor transversally forms a parasitic NPN bipolar transistor with the p-well region and the n-well region.

The parasitic PNP bipolar transistor and the parasitic NPN bipolar transistor together form a parasitic PNPN structure. When the PNPN structure is conducted, the latch-up is formed.

The latch-up means that the circuit formed by the parasitic bipolar transistors in the CMOS integrated circuit is triggered in a specific condition to form a low resistance path through which a large current passes. With the existence of positive feedback loop, the latch-up occurs to cause the CMOS integrated circuit unable to work normally or even cause the chip to be damaged. It is known that the abnormal large current can be detected using an additional circuit and normal work of the circuit can be recovered by resetting the system. However, resetting the system during operation is not a realistic option.

Accordingly, the present disclosure further provides a logic circuit that can prevent the latch-up without altering the routing of digital circuit or changing the circuit structure.

SUMMARY

The present disclosure provides a logic circuit that increases the holding voltage by additionally doping a P+ active region and an N+ active region so as to prevent the latch-up of a silicon control rectifier.

The present disclosure provides a logic circuit including a PMOS transistor and an NMOS transistor. The PMOS transistor includes an n-well region, a P+ active region, an N+ active region and a first contact. The P+ active region is configured as a source of the PMOS transistor and arranged in the n-well region. The N+ active region is arranged in the n-well region. The first contact is electrically in contact with the P+ active region and the N+ active region in the n-well region. The NMOS transistor includes a p-well region, an N+ active region, a P+ active region and a second contact. The N+ active region is configured as a source of the NMOS transistor and arranged in the p-well region. The P+ active region is arranged in the p-well region. The second contact is electrically in contact with the N+ active region and the P+ active region in the p-well region.

The present disclosure further provides a logic circuit including a PMOS transistor and an NMOS transistor. The gate of the PMOS transistor is electrically connected to a gate of the NMOS transistor via a poly routing extending along a first direction. The first contact of the PMOS transistor covers on a P+ active region, which is configured as a source of the PMOS transistor, and an additional N+ active region adjacent to each other in the first direction. The second contact of the NMOS transistor covers on an N+ active region, which is configured as a source of the NMOS transistor, and an additional P+ active region adjacent to each other in the first direction.

The latch-up of a parasitic SCR is known to the art, and thus details thereof are not described herein. The present disclosure is to provide a circuit structure capable of preventing the occurrence of latch-up.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

The structure of the present disclosure is adapted to an internal logic circuit of an integrated circuit package, e.g., a CMOS integrated circuit, but not limited thereto. In the logic circuit that adopts a poly routing to connect gates of PMOS and NMOS transistors, because there is no guard ring between the PMOS transistor and the NMOS transistor, the parasitic silicon control rectifier (SCR) thereof is easily triggered by the external interference (e.g., radiation) to cause the latch-up. Therefore, the present disclosure increases an occurrence condition of the latch-up by additionally doping a P+ active region and an N+ active region.

Figure 1:
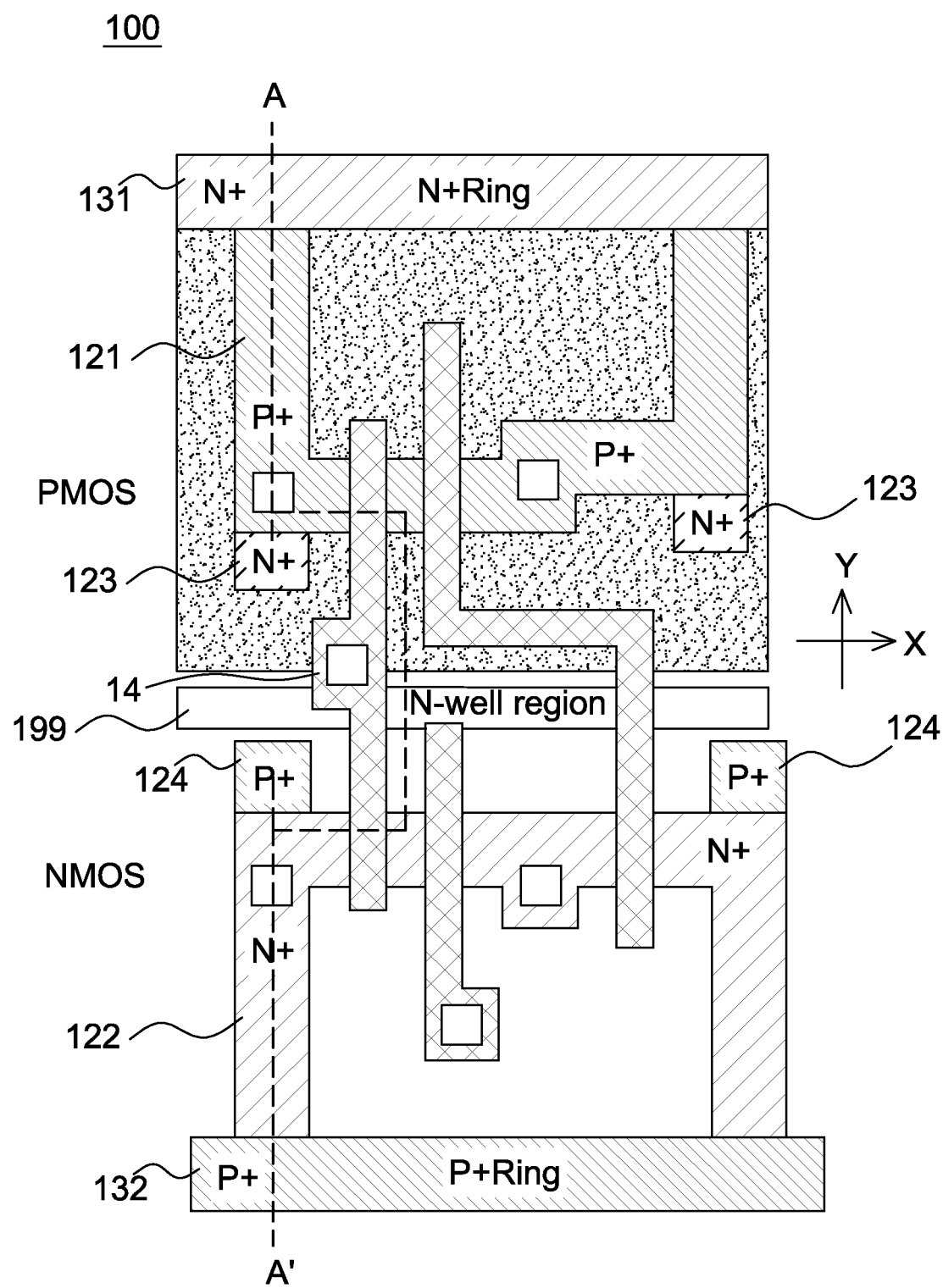
FIG. 1 is an upper view of a logic circuit according to one embodiment of the present disclosure.
Figure 2:
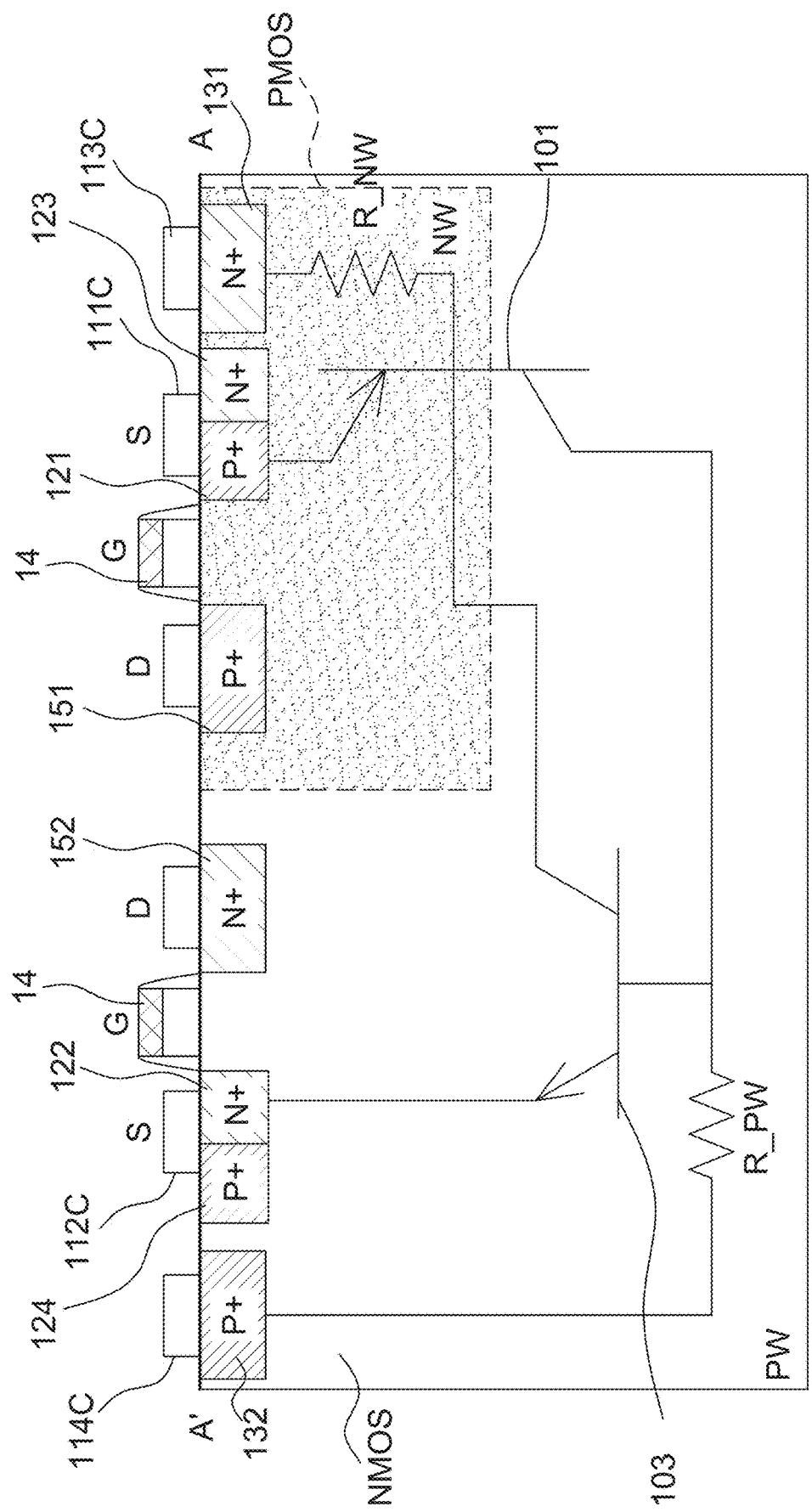
FIG. 2 is a cross sectional view along line A-A' in the logic circuit of FIG. 1.

Please referring to FIGS. 1 and 2, FIG. 1 is an upper view of a logic circuit 100 according to one embodiment of the present disclosure, and FIG. 2 is a cross sectional view along line A-A' in the logic circuit 100 of FIG. 1. The logic circuit 100 includes a PMOS transistor and an NMOS transistor arranged along a first direction (e.g., Y-direction in FIG. 1).

The PMOS transistor includes a P+ active region 121 used as a source, a P+ active region 151 used as a drain, a gate 14 and an N+ guard ring 131 doped in the n-well region NW. In this embodiment, the N+ guard ring 131 is arranged only at a side far from the NMOS transistor without extending between the PMOS transistor and the NMOS transistor, as shown in FIG. 1.

The NMOS transistor includes an N+ active region 122 used as a source, an N+ active region 152 uses as a drain, a gate 14 and a P+ guard ring 132 doped in the p-well region PW. In this embodiment, the P+ guard ring 132 is arranged only at a side far from the PMOS transistor without extending between the PMOS transistor and the NMOS transistor, as shown in FIG. 1.

Because there is no guard ring between the PMOS transistor and the NMOS transistor, the gate 14 of the PMOS transistor and the gate 14 of the NMOS transistor are electrically connected via a poly routing in the first direction Y. It is appreciated that the pattern of the poly routing is not limited to those (e.g., regions filled with crossed lines in FIG. 1) shown in FIG. 1 as long as the gates 14 of the PMOS and NMOS transistors are connected thereby.

Figure 3A:
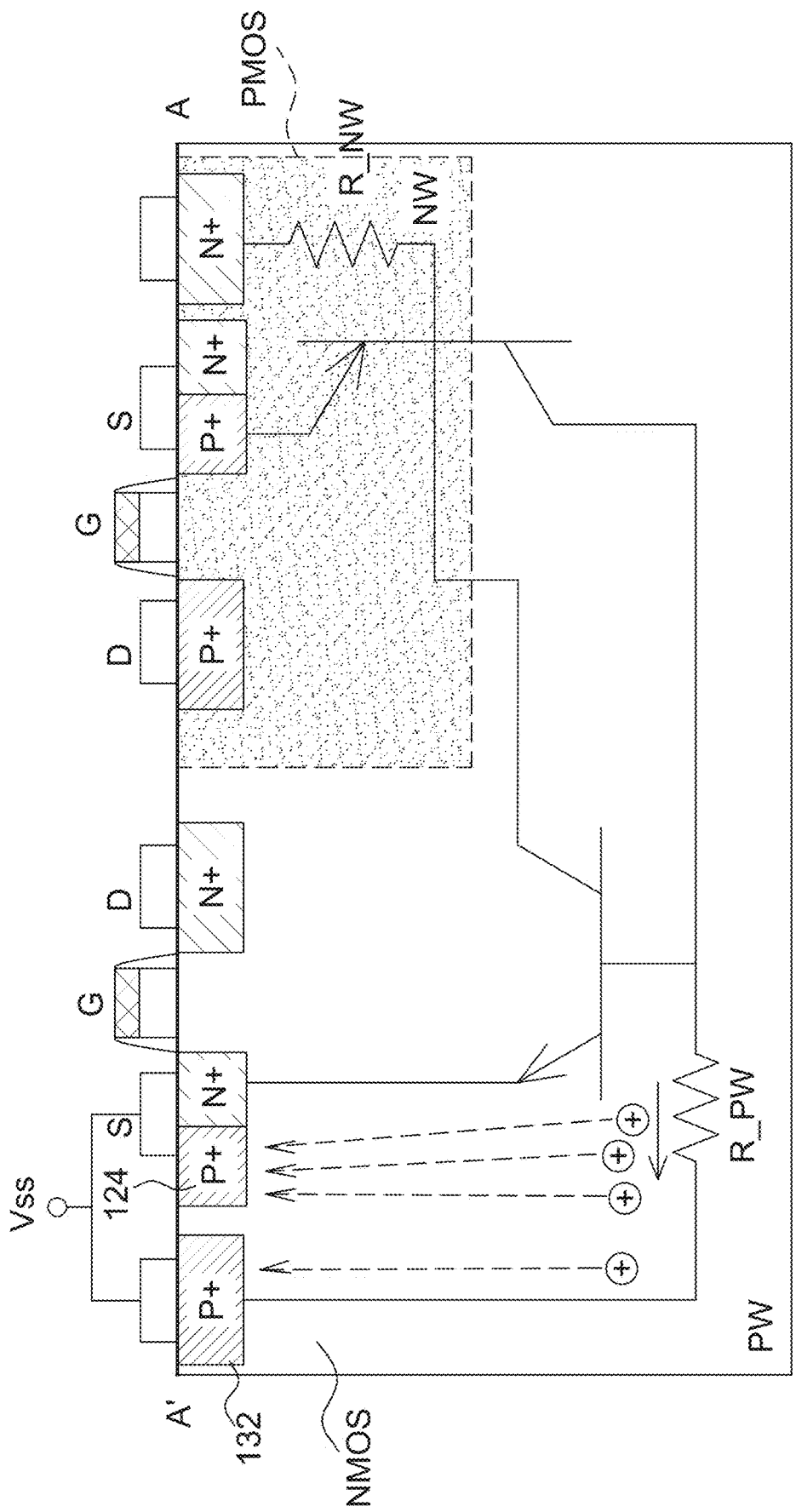
FIG. 3A is a schematic diagram of a logic circuit of the present disclosure interfered by electric holes.
Figure 3B:
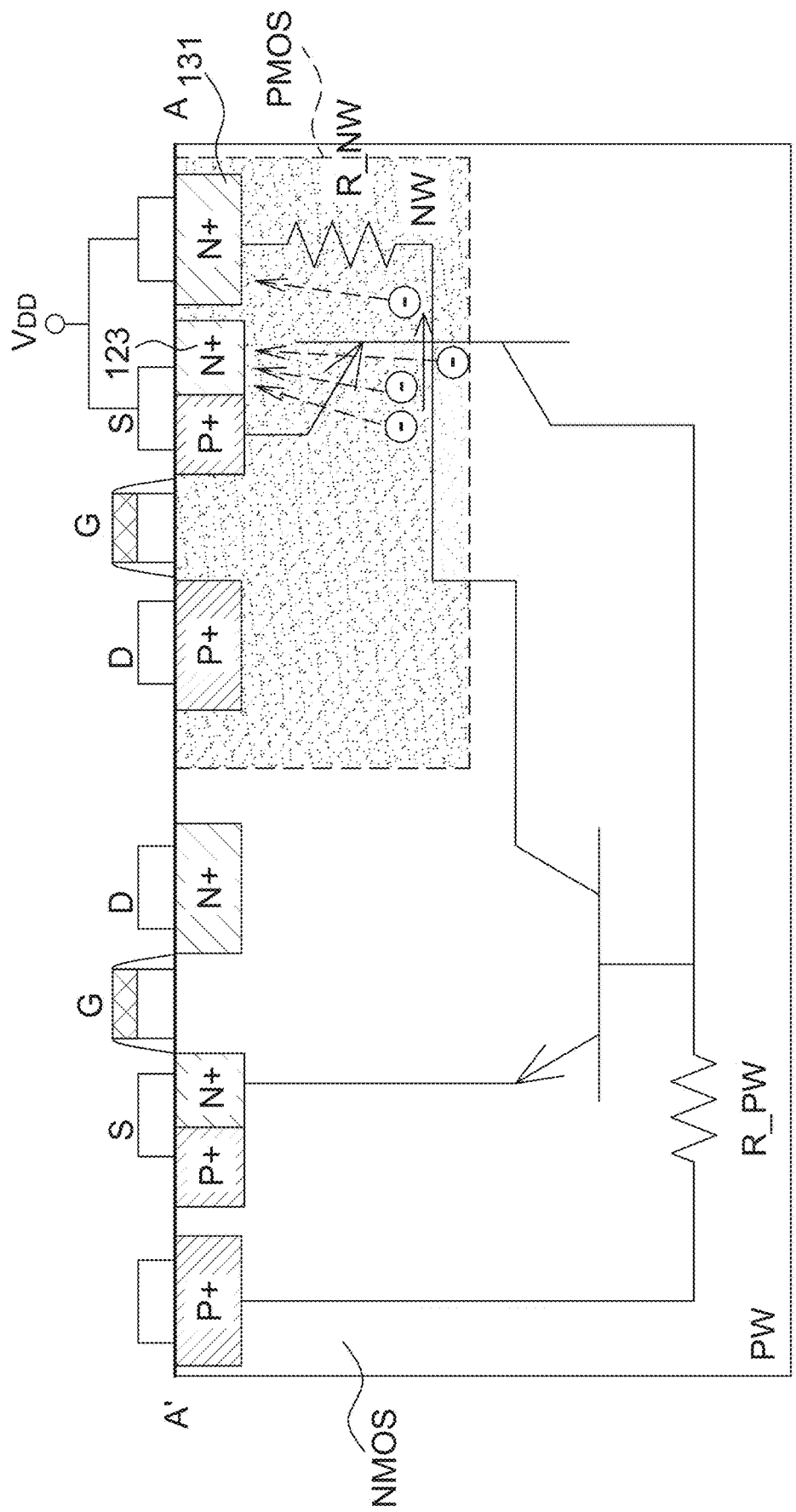
FIG. 3B is a schematic diagram of a logic circuit of the present disclosure interfered by electrons.

The PMOS transistor further includes a first contact 111C covering on and electrically in contact with the P+ active region 121, and a third contact 113C covering on and electrically in contact with the N+ guard ring 131, wherein the third contact 113C and the first contact 111C are physically separated from each other on a surface of the PMOS transistor. In operation, the third contact 113C and the first contact 111C are together connected to a voltage source $V_{DD}$, as shown in FIG. 3B.

The NMOS transistor further includes a second contact 112C covering on and electrically in connect with the N+ active region 122, and a fourth contact 114C covering on and electrically in contact with the P+ guard ring 132, wherein the fourth contact 114C and the second contact 112C are physically separated from each other on a surface of the NMOS transistor. In operation, the second contact 112C and the fourth contact 114C are together connected to a ground voltage $V_{SS}$, a voltage thereof being lower than the voltage source $V_{DD}$, as shown in FIG. 3A.

The P+ active region 121 used as a source of the PMOS transistor, the n-well region NW and the p-well region PW of the PMOS transistor longitudinally form a parasitic PNP structure 101. The N+ active region 122 used as a source of the NMOS transistor, the p-well region PW and the n-well region NW of the PMOS transistor transversally form a parasitic NPN structure 103. The parasitic PNP structure 101 and the parasitic NPN structure together form a silicon control rectifier (SCR), which is known to the art and thus details thereof are not described.

When the logic circuit 100 is interfered by electric holes, a resistor R_PW of the p-well region PW has a voltage drop thereon. When the voltage drop is larger than a threshold voltage (e.g., 0.7 volt), the parasitic NPN structure 103 is conducted to operate in the amplifying state and create a positive feedback to conduct the parasitic PNP structure 101 such that the latch-up is created. In the present disclosure, to prevent the occurrence of latch-up, the NMOS transistor further includes an additional P+ active region 124 arranged in the p-well region PW, and the second contact 112C covers on and electrically contacts the N+ active region 122 and the additional P+ active region 214 which are adjacent to each other along the Y-direction.

In one aspect, the N+ active region 122 and the additional P+ active region 124 in the p-well region PW connect to each other inside the p-well region PW by silicide. More specifically, at least a part of a doping region of the N+ active region 122 overlaps a doping region of the additional P+ active region 124 inside the p-well region PW.

In another aspect, the N+ active region 122 and the additional P+ active region 124 in the p-well region PW are separated from each other inside the p-well region PW. That is, a doping region of the N+ active region 122 does not overlap a doping region of the additional P+ active region 124 inside the p-well region PW. For example, the second contact 112C has a larger area to cover both the N+ active region 122 and the additional P+ active region 124; or, a second sub-contact is respectively arranged on the N+ active region 122 and the additional P+ active region 124, and the second sub-contacts are connected via a metal line to form the second contact 112C.

Figure 4:
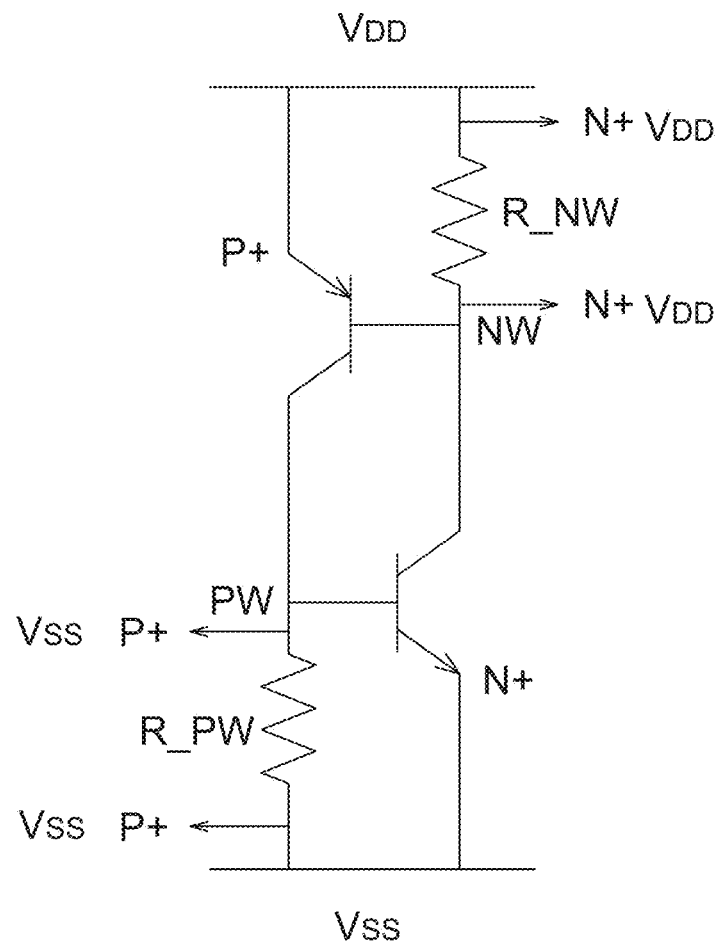
FIG. 4 is a circuit diagram of a parasitic silicon control rectifier of a logic circuit according to one embodiment of the present disclosure.

As shown in FIG. 3A, when the source and the P+ guard ring 132 of the NMOS transistor are connected to the ground voltage $V_{SS}$, by additionally arranging a P+ active region 124, a part of electric holes are absorbed by the additional P+ active region 124 rather than passing the resistor R_PW of the p-well region PW so as to reduce the voltage drop on the resistor R_PW of the p-well region PW thereby preventing the parasitic NPN structure 103 from being conducted. Furthermore, as shown in FIG. 4, the additional P+ active region 124 forces two ends of the resistor R_PW of the p-well region PW to be connected to the ground voltage $V_{SS}$ so as to remove the voltage drop on the resistor R_PW.

When the logic circuit 100 is interfered by electrons, a resistor R_NW of the n-well region NW has a voltage drop thereon. When the voltage drop is larger than a threshold voltage (e.g., 0.7 volt), the parasitic PNP structure 101 is conducted to operate in the amplifying state and create a positive feedback to conduct the parasitic NPN structure 103 such that the latch-up is created. In the present disclosure, to prevent the occurrence of latch-up, the PMOS transistor further includes an additional N+ active region 123 arranged in the n-well region NW, and the first contact 111C covers on and electrically contacts the P active region 121 and the additional N+ active region 123 which are adjacent to each other along the Y-direction.

In one aspect, the P+ active region 121 and the additional N+ active region 123 in the n-well region NW connect to each other inside the n-well region NW by silicide. More specifically, at least a part of a doping region of the P+ active region 121 overlaps a doping region of the additional N+ active region 123 inside the n-well region NW.

In another aspect, the P+ active region 121 and the additional N+ active region 123 in the n-well region NW are separated from each other inside the n-well region NW. That is, a doping region of the P+ active region 121 does not overlap a doping region of the additional N+ active region 123 inside the n-well region NW. For example, the first contact 111C has a larger area to cover both the P+ active region 121 and the additional N+ active region 123; or, a first sub-contact is respectively arranged on the P+ active region 121 and the additional N+ active region 123, and the first sub-contacts are connected via a metal line to form the first contact 111C.

As shown in FIG. 3B, when the source and the N+ guard ring 131 of the PMOS transistor are connected to the voltage source $V_{DD}$, by additionally arranging an N+ active region 123, a part of electrons are absorbed by the additional N+ active region 123 rather than passing the resistor R_NW of the n-well region NW so as to reduce the voltage drop on the resistor R_NW of the n-well region NW thereby preventing the parasitic PNP structure 101 from being conducted. Furthermore, as shown in FIG. 4, the additional N+ active region 123 forces two ends of the resistor R_NW of the n-well region NW to be connected to the voltage source $V_{DD}$ so as to remove the voltage drop on the resistor R_NW.

Figure 5:
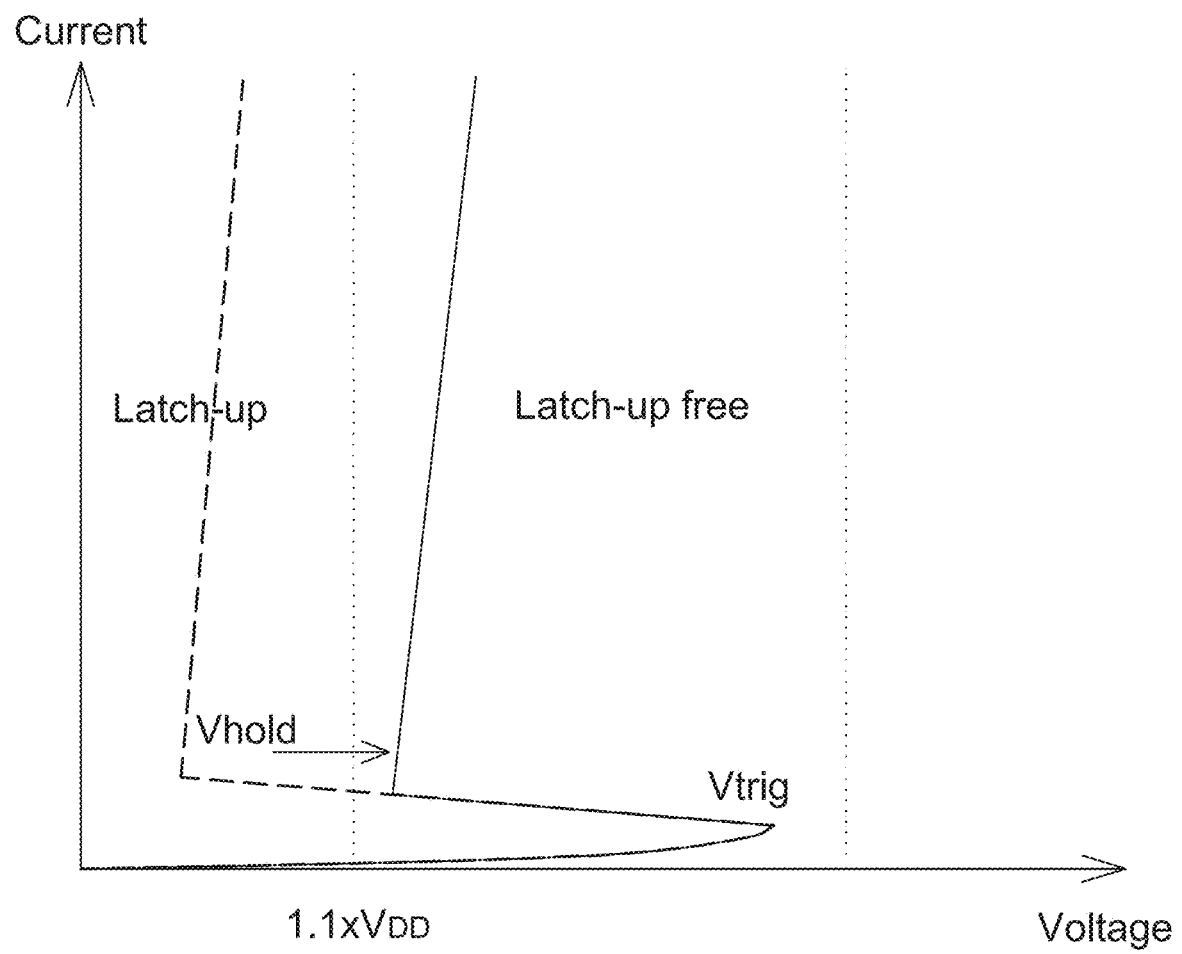
FIG. 5 is a transmission line pulse I-V curve of a parasitic silicon control rectifier of a logic circuit according to one embodiment of the present disclosure.

As shown in FIG. 5, the present disclosure increases the holding voltage Vhold (e.g., shown to be larger than 1.1× $V_{DD}$) from a latch-up zone into a latch-up free zone by doping N+ active region 123 and P+ active region 124 so as to reduce the possibility of triggering the SCR into the latch-up state.

It should be mentioned that although FIG. 1 shows that the additional P+ active regions 124 of the NMOS transistor are arranged at a side, close to the PMOS transistor, of the N+ active region 122 of the NMOS transistor, and the additional N+ active regions 123 of the PMOS transistor are arranged at a side, close to the NMOS transistor, of the P+ active region 121 of the PMOS transistor, the present disclosure is not limited thereto. It is possible to arrange the N+ active regions 123 at a transverse direction (e.g., X-direction in FIG. 1) adjacent to the P+ active region 121, and the P+ active regions 124 are arranged in the transverse direction X adjacent to the N+ active region 122 as long as the additional heavily doped regions are close to a space between the PMOS transistor and the NMOS transistor as much as possible.

In another aspect, in the case that the chip is interfered only by positive charges or electric holes, it is possible to add an additional P+ active region 124 in the NMOS transistor without adding the N+ active region 123 in the PMOS transistor. In an alternative aspect, in the case that the chip is interfered only by negative charges or electrons, it is possible to add an additional N+ active region 123 in the PMOS transistor without adding the P+ active region 124 in the NMOS transistor.

In another aspect, it is possible to additionally arrange an n-well region 199 between the PMOS transistor and the NMOS transistor, and parallel to the N+ guard ring 131, and the n-well region 199 is physically separated from the N+ guard ring 131 of the PMOS transistor. The occurrence condition of the latch-up is also increased by this way.

As mentioned above, when the latch-up of a logic circuit occurs, the chip is not able to work normally and the system needs to be reset. Accordingly, the present disclosure further provides a digital circuit (e.g., FIGS. 1-2) with an increased holding voltage to prevent the occurrence of latch-up without altering the routing of digital circuit or changing the circuit structure such that it is easily to be implemented in the standard logic cell.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A logic circuit, comprising:
   a PMOS transistor, comprising:
      an n-well region;
      a P+ active region, configured as a source of the PMOS transistor and arranged in the n-well region;
      an N+ active region, arranged in the n-well region and not configured as a guard ring;
      an N+ guard ring arranged in the n-well region to be physically separated from the N+ active region of the PMOS transistor; and
      a first contact, electrically in contact with the P+ active region and the N+ active region in the n-well region;
   an NMOS transistor, comprising:
      a p-well region;
      an N+ active region, configured as a source of the NMOS transistor and arranged in the p-well region;
      a P+ active region, arranged in the p-well region and not configured as a guard ring; and
      a second contact, electrically in contact with the N+ active region and the P+ active region in the p-well region; and
   an additional n-well region arranged between the PMOS transistor and the NMOS transistor, parallel to the N+ guard ring, and physically separated from the N+ guard ring of the PMOS transistor.

2. The logic circuit as claimed in claim 1, wherein the PMOS transistor and the NMOS transistor respectively comprise a poly-Si gate connected by a poly routing.

3. The logic circuit as claimed in claim 1, wherein
   the N+ active region of the PMOS transistor is arranged at a side of the P+ active region of the PMOS transistor close to the NMOS transistor, and
   the P+ active region of the NMOS transistor is arranged at a side of the N+ active region of the NMOS transistor close to the PMOS transistor.

4. The logic circuit as claimed in claim 1, wherein
   the first contact and a third contact of the N+ guard ring are both connected to a voltage source.

5. The logic circuit as claimed in claim 4, wherein the N+ guard ring is not extended between the PMOS transistor and the NMOS transistor.

6. The logic circuit as claimed in claim 1, wherein
   the NMOS transistor further comprises a P+ guard ring arranged in the p-well region to be physically separated from the P+ active region of the NMOS transistor, and
   the second contact and a fourth contact of the P+ guard ring are both connected to a ground voltage.

7. The logic circuit as claimed in claim 6, wherein the P+ guard ring is not extended between the PMOS transistor and the NMOS transistor.

8. A logic circuit, comprising:
   a PMOS transistor and an NMOS transistor, wherein
      a gate of the PMOS transistor is electrically connected to a gate of the NMOS transistor via a poly routing extending along a first direction,
      a first contact of the PMOS transistor covers on a P+ active region, which is configured as a source of the PMOS transistor, and an additional N+ active region, which is not configured as a guard ring, adjacent to each other in the first direction in an n-well region, and
      a second contact of the NMOS transistor covers on an N+ active region, which is configured as a source of the NMOS transistor, and an additional P+ active region, which is not configured as a guard ring, adjacent to each other in the first direction in a p-well region;
   a third contact, covering on an N+ guard ring of the PMOS transistor, wherein
      the third contact and the first contact are physically separated on a surface of the PMOS transistor, and
      the N+ guard ring is physically separated from the additional N+ active region; and
   an additional n-well region arranged between the PMOS transistor and the NMOS transistor, parallel to the N+ guard ring, and physically separated from the N+ guard ring of the PMOS transistor.

9. The logic circuit as claimed in claim 8, further comprising:
   a fourth contact, covering on a P+ guard ring of the NMOS transistor, wherein
      the fourth contact and the second contact are physically separated on a surface of the NMOS transistor, and
      the P+ guard ring is physically separated from the additional P+ active region.

10. The logic circuit as claimed in claim 9, wherein
the third contact and the first contact are configured to connect to a voltage source together, and
the fourth contact and the second contact are configured to connect to a ground voltage together.

11. The logic circuit as claimed in claim 8, wherein
a first sub-contact is respectively arranged on the P+ active region and the additional N+ active region of the PMOS transistor, and the first sub-contacts are connected by a metal line to form the first contact, and
a second sub-contact is respectively arranged on the N+ active region and the additional P+ active region of the NMOS transistor, and the second sub-contacts are connected by another metal line to form the second contact.

\* \* \* \* \*